United States Patent
Zeller

(10) Patent No.: US 11,226,386 B2
(45) Date of Patent: Jan. 18, 2022

(54) SYSTEMS AND METHODS FOR IMPROVED SIMULTANEOUS MULTI-SLICE (SMS) RECORDING OF SCAN DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/038,480

(22) Filed: Sep. 30, 2020

(65) Prior Publication Data

US 2021/0096201 A1  Apr. 1, 2021

(51) Int. Cl.
*G01V 3/00* (2006.01)
*G01R 33/483* (2006.01)
*G01R 33/54* (2006.01)
*G01R 33/58* (2006.01)

(52) U.S. Cl.
CPC ....... *G01R 33/4835* (2013.01); *G01R 33/543* (2013.01); *G01R 33/58* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| 10,126,394 | B2 | 11/2018 | Beck et al. | |
| 2014/0247046 | A1* | 9/2014 | Grinstead | G01R 33/4835 324/309 |
| 2015/0309147 | A1* | 10/2015 | Schmitter | G01R 33/5612 600/410 |
| 2017/0146631 | A1 | 5/2017 | Beck et al. | |

(Continued)

FOREIGN PATENT DOCUMENTS

| DE | 102013219034 A1 | 3/2015 |
| DE | 102015222835 A1 | 5/2017 |
| EP | 3333584 A1 | 6/2018 |

OTHER PUBLICATIONS

Barth, Makus et al., "Simultaneous Multislice (SMS) Imaging Techniques," Magnetic Resonance in Medicine, vol. 75, pp. 63-81 (2016).

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method for improved recording of scan data of an examination object by means of a magnetic resonance system with the aid of a simultaneous multi-slice (SMS) method, a minimum repetition time TR is determined dependent upon a quality criterion. The quality criterion herein extends the scan time, which is actually greatly shortened by the use of an SMS method, for the MR signals of the slice stack to be recorded, to the minimum repetition time TR. The "time reserve" thereby obtained (the difference of the determined minimum repetition time TR from the scan time (Continued)

needed for the slice stack to be recorded purely by means of the SMS method) is utilized to take account of further slices in the recording of the MR signals. By this means, firstly, further information can be obtained and, secondly, the image quality of the image data obtained is improved.

16 Claims, 3 Drawing Sheets

(56) References Cited

U.S. PATENT DOCUMENTS

2017/0205486 A1\* 7/2017 Zeller ................ G01R 33/4835
2018/0299524 A1 10/2018 Feiweier

OTHER PUBLICATIONS

Breuer, Felix et al., "Controlled Aliasing in Parallel Imaging Results in Higher Acceleration (CAIPIRINHA) for Multi-Slice Imaging," Magnetic Resonance in Medicine, vol. 53, No. 3, pp. 684-691 (2005).
Setsompop, Kawin et al., "Blipped-Controlled Aliasing in Parallel Imaging for Simultaneous Multislice Echo Planar Imaging with Reduced g-Factor Penalty," Magnetic Resonance in Medicine, vol. 67, pp. 1210-1224 (2012).
European Search Report for German Application No. 19200342.4 dated Apr. 9, 2020.

\* cited by examiner

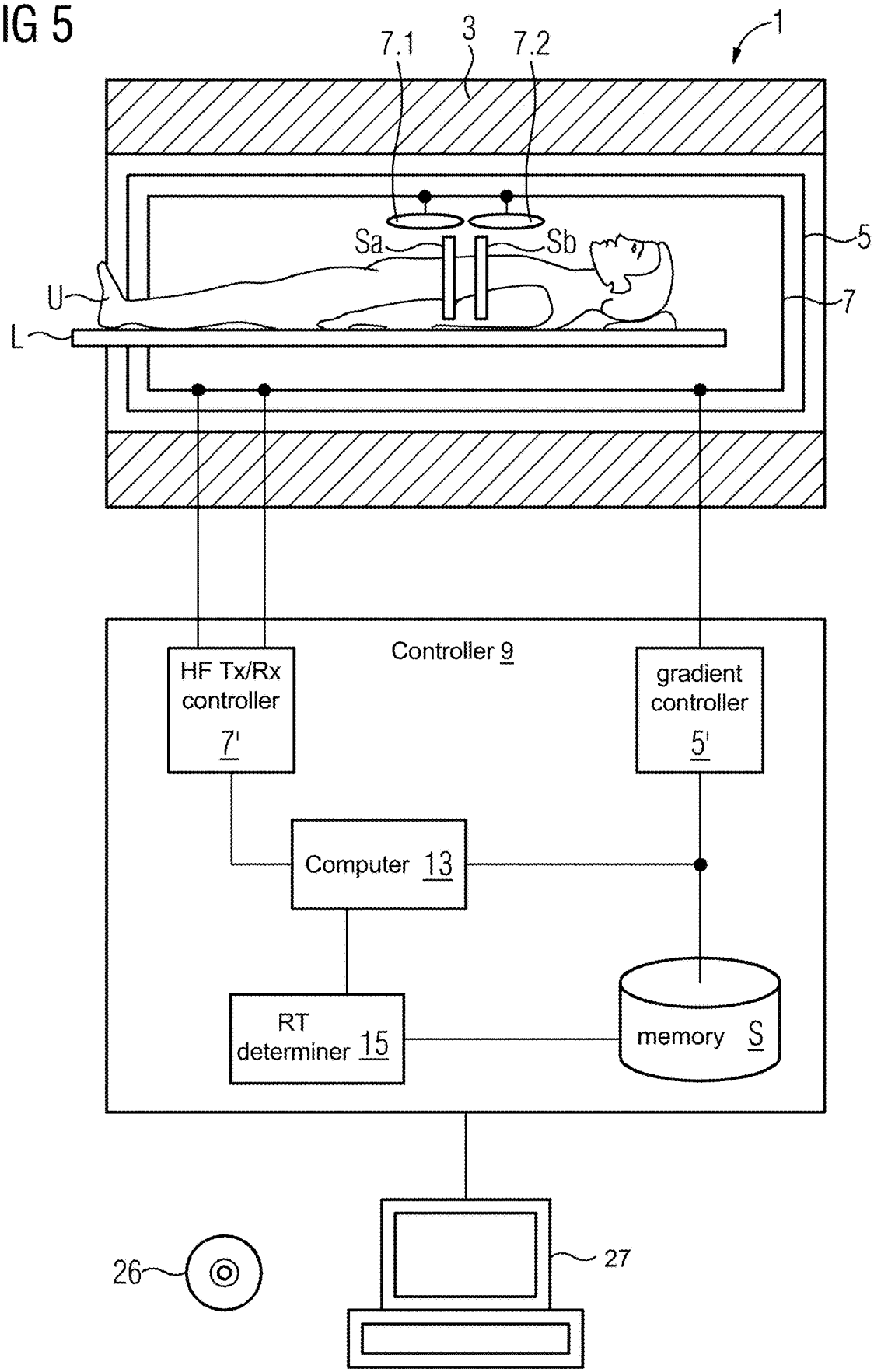

SYSTEMS AND METHODS FOR IMPROVED SIMULTANEOUS MULTI-SLICE (SMS) RECORDING OF SCAN DATA

CROSS REFERENCE TO RELATED APPLICATIONS

This patent application claims priority to European Patent Application No. 19200342.4, filed Sep. 30, 2019, which is incorporated herein by reference in its entirety.

BACKGROUND

Field

The disclosure relates to an improved simultaneous multi-slice recording of scan data by means of magnetic resonance technology.

Related Art

Magnetic resonance technology (hereinafter, the abbreviation MR stands for magnetic resonance) is a known technology with which images of the interior of an examination object can be generated. Expressed simply, for this purpose, the examination object is positioned in a magnetic resonance device in a relatively strong, static, homogeneous main magnetic field, also known as the $B_0$ field, with field strengths of 0.2 tesla to 7 tesla or more, so that its nuclear spins orient themselves along the main magnetic field. In order to trigger nuclear spin resonances, high frequency excitation pulses (RF pulses) are radiated into the examination object and the nuclear spin resonances produced are measured as so-called k-space data and, on the basis thereof, MR images are reconstructed or spectroscopic data is determined. For position encoding of the scan data, rapidly switched magnetic gradient fields, known as gradients for short, are overlaid on the main magnetic field. A pattern used which defines a temporal sequence of RF pulses to be radiated in and gradients to be switched is known as a pulse sequence (scheme) or "sequence" for short. The scan data recorded is digitized and stored as complex numerical values in a k-space matrix. From the k-space matrix loaded with values, an associated MR image is reconstructable, for example, by means of a multi-dimensional Fourier transform. The RF pulses are generated by means of a radio frequency power amplifier (RFPA). In which parts of the examination object the resonant excitation of nuclear spins takes place is dependent thereby on the effective local strength of the magnetic field and the frequency of the RF pulses, since the resonance frequency of the nuclear spins is itself dependent on the local magnetic field strength. By means of corresponding variation, a selective excitation of a particular layer of the examination object can therefore take place in a targeted manner.

So-called parallel acquisition techniques (ppa) such as GRAPPA (GeneRalized Autocalibrating Partially Parallel Acquisition) or SENSE (Sensitivity Encoding) are used in which, with the aid of a plurality of RF coils, only a number of scan data items undersampled in the k-space according to the Nyquist theorem are recorded, in order, for example, to shorten the scan time necessary overall for the recording of the scan data or to increase the resolution. The "missing" scan data that is not sampled, but is needed for a complete set of scan data according to the Nyquist method are hereby enhanced on the basis of sensitivity data of the RF coils used and calibration data and the measured scan data.

The wish for ever faster MR recordings in the clinical environment is leading to a resurgence of methods in which a plurality of images are recorded simultaneously. In general, these methods can be characterized in that at least during a part of the scan, targeted transverse magnetization of at least two slices is used simultaneously for the imaging process ("simultaneous multi-slice imaging or SMS"). In contrast thereto, in the established multi-slice imaging, the signal is recorded from at least two slices alternatingly, i.e. completely independently of one another with correspondingly longer scan times.

Known SMS methods are, for example, methods which use methods from the aforementioned imaging by means of ppa in which knowledge regarding the sensitivity distribution of the receiving coils used during the acquisition of the scan data is utilized as additional information in order to fill up undersampled scan data according to the Nyquist method in the slice direction, in order to separate signals recorded overlaid from a plurality of slices into signals of the individual slices. These methods include, for example, the CAIPIRINHA technique as described by Breuer et al. in "Controlled Aliasing in Parallel Imaging Results in Higher Acceleration (CAIPIRINHA) for Multi-Slice Imaging", in Magnetic Resonance in Medicine 53, 2005, pp. 684-691 and the blipped CAIPIRINHA technique as described by Setsompop et al. in "Blipped-Controlled Aliasing in Parallel Imaging for Simultaneous Multi-slice Echo Planar Imaging With Reduced g-Factor Penalty", in Magnetic Resonance in Medicine 67, 2012, pp. 1210-1224, wherein the g-factor (geometry factor) mentioned in the latter publication is a measure of a separability of the different receiving coils used.

SMS techniques for MR imaging in combination with a plurality of common pulse sequence types, e.g. echoplanar SMS imaging with BOLD ("blood oxygenation level-dependent") contrast; SMS EPI BOLD, echoplanar SMS diffusion imaging ("echo-planar diffusion weighted imaging"; SMS EPI diffusion, SMS EPI DWI), also with RESOLVE ("readout-segmented echo-planar imaging"), turbo-spin echo SMS (SMS TSE), also in combination with Dixon techniques (e.g. SMS TSE Dixon) are now known.

By means of the simultaneous recording of a plurality of slices, typically, the repetition time TR and thus the overall recording time can be reduced. The repetition time TR is herein the scan time needed for the recording of all the scan data from a desired slice stack, e.g. following a preparation of the entire slice stack or for time-resolved image series in each case, or for a single recording of the scan data of the desired slice stack. Since, in many cases a certain image contrast can only be achieved if the repetition time TR is selected to be sufficiently long, e.g. in order to permit a sufficient relaxation of a magnetization before a renewed excitation of spins in the slice stack, a scan time reduction actually achievable by the use of SMS techniques is often not directly proportional to the number of simultaneously recorded slices, which is also designated the SMS factor.

In order to be able to separate simultaneously recorded scan data from a plurality of slices into scan data of the individual slices, the sensitivity distribution of the receiving coils used during the acquisition of the scan data must have a sufficient variation in order to make the scan data of the individual slices distinguishable. Therefore, the greater the variation in the sensitivity distribution of the receiving coils used for acquiring the scan data, the greater the image quality in MR images generated by SMS techniques. It is therefore useful to select the slices from which scan data is to be recorded simultaneously as far apart from one another as possible. Therefore, SMS techniques in MR imaging protocols with only a few slices in total and therefore slice stacks of only a few centimeters, e.g. less than 4 cm or with an only small slice coverage with slice thicknesses of less than 5 millimeters have conventionally been useful to only a limited extent, e.g. for a prostate, spinal column or orbital imaging.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 5 is a magnetic resonance system according to an exemplary embodiment of the disclosure.

Figure 1:
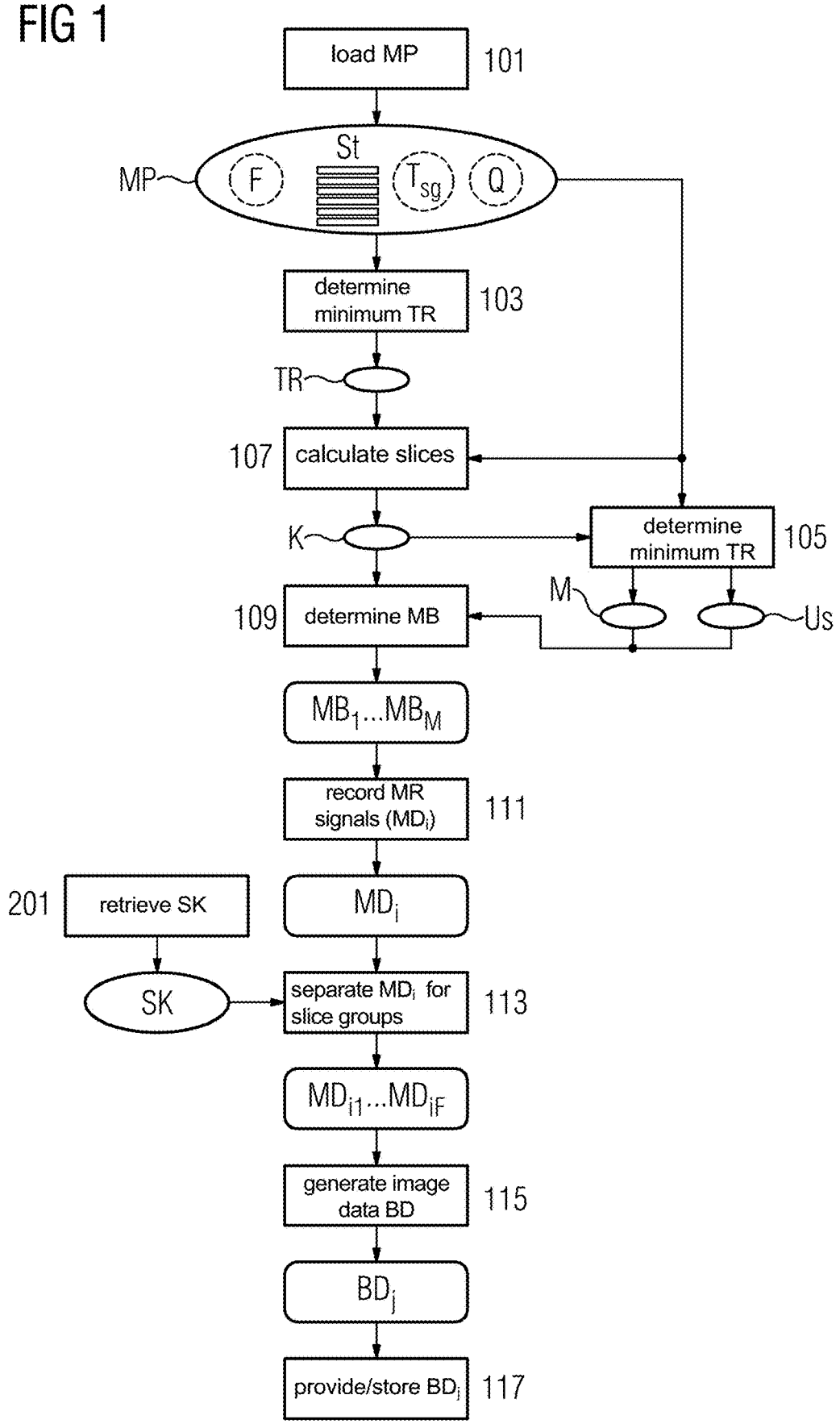
FIG. 1 is a flowchart of a method according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the FIGS. between functional units or other elements can also be implemented as indirect connections, wherein a connection can be wireless or wired. Functional units can be implemented as hardware, software or a combination of hardware and software.

An object of the present disclosure it to enable an improved simultaneous multi-slice (SMS) recording of scan data by means of magnetic resonance technology which permits, in particular, SMS recordings to be made useable also for applications in which thin slices and/or slice stacks of only small overall extent are to be mapped, for example, in MR prostate imaging, MR spinal imaging or MR orbital imaging.

A method according to the disclosure for improved recording of scan data of an examination object by means of a magnetic resonance system with the aid of a simultaneous multi-slice (SMS) method using at least two receiving coils, wherein magnetic resonance (MR) signals are recorded in at least two slice groups of different slices of the examination object, wherein slices included by a slice group are recorded simultaneously during a recording of MR signals, comprises the steps:

loading a scan protocol with which the MR signals are to be recorded and which comprises a slice stack to be recorded, an SMS factor F to be used during the recording and at least one quality criterion, determining a minimum repetition time TR dependent upon the at least one quality criterion, calculating a number K of slices from which MR signals can be recorded with a number M of possible excitations and recordings of MR signals of a slice group within the determined minimum repetition time, said number M being determined on the basis of a slice group scan time specified by the scan protocol for exciting and recording MR signals of a slice group and of the determined minimum repetition time TR, determining multi-band RF pulses for exciting M slice groups each comprising F slices which altogether comprise the slice stack to be recorded, recording MR signals using the multi-band RF pulses within the determined minimum repetition time, loading slice separation calibration data for the slice stack to be recorded, separating the MR signals of the slice groups respectively into single slice MR signals of the individual slices included by the slice groups making use of the slice separation calibration data, generating image data of at least one slice included by the slice stack to be recorded, by reconstruction of the single slice MR signals of the slice.

The quality criterion herein extends the scan time, which is actually greatly shortened by the use of an SMS method, for the MR signals of the slice stack to be recorded, to the minimum repetition time TR. The "time reserve" thereby obtained (the difference of the determined minimum repetition time TR from the scan time needed for the slice stack to be recorded purely by means of the SMS method) is utilized according to the disclosure to take account of further slices in the recording of the MR signals. By taking account of further slices, firstly, further information can be obtained which can be used, for example, for correction methods. Secondly, taking account of further slices increases the image quality of the image data obtained, since it enables the spacing of slices from which MR signals are simultaneously recorded to be increased. Thereby, the variation in the sensitivity pattern of the receiving coils used becomes increased, whereby the MR signals recorded overlaid from a plurality of slices can be better separated again.

The method is used, in particular, for scan protocols in which the slices to be recorded have a slice thickness of less than 3 millimeters, preferably less than 2 millimeters, particularly preferably approximately 1 millimeter and/or the slice stack to be scanned has a thickness of less than 4 centimeters, preferably less than 3 centimeters, particularly preferably less than 2 centimeters. In the case of such thin slices and slice stacks with such a small thickness (extent in the slice direction) it is particularly advantageous if by the method according to the disclosure, a spacing of slices to be recorded simultaneously can be increased and thus a distance between slices to be simultaneously recorded can be increased. In some cases, only by means of a method according to the disclosure can the spacing of slices to be recorded simultaneously be selected large enough (e.g. above the quality criterion) in order to create, by means of a sensitivity distribution of the receiving coils used in the recording of the scan data, a sufficient variation in the simultaneously recorded scan data which permits the scan data recorded for a plurality of slices to be separated into single slice scan data such that from the single slice scan data, image data of the individual slices can be generated with an acceptable image quality, e.g. sufficient for a diagnosis.

A magnetic resonance system according to the disclosure comprises a magnet unit, a gradient unit, a high frequency unit and a controller for carrying out a method according to the disclosure with a repetition time determining unit.

A computer program according to the disclosure implements a method according to the disclosure on a controller, when it is executed on the controller.

The computer program can herein also be present in the form of a computer program product which is directly loadable into a memory store of a controller, having program code means in order to carry out an inventive method when the computer program product is executed in the computer unit of the computer system.

An inventive electronically readable data carrier comprises electronically readable control information stored thereon, which comprises at least one computer program according to the disclosure and is configured such that, on use of the data carrier in a controller of a magnetic resonance system, it carries out an inventive method.

The advantages and details set out in relation to the method apply accordingly for the magnetic resonance system, the computer program product and the electronically readable data carrier or medium.

FIG. 1 is a schematic flow diagram of a method according to an exemplary embodiment of the disclosure for improved recording of scan data of an examination object by means of a magnetic resonance system with the aid of a simultaneous multi-slice (SMS) method using at least two receiving coils in which magnetic resonance (MR) signals are recorded in at least two slice groups of different slices of the examination object, wherein slices included by a slice group are recorded simultaneously during a recording of MR signals $MD_i$.

Herein, firstly a scan protocol MP is loaded (block 101). The scan protocol comprises information relating to a slice stack St to be recorded, an SMS factor F to be used during the recording and at least one quality criterion Q. Also defined with the slice stack St is the number N of slices from which (at least) MR signals are to be recorded, their slice thickness d and their position in the examination object.

Dependent upon the at least one quality criterion, a minimum repetition time TR is determined (block 103) within which all the MR signals necessary for a generation of image data of all the slices of the slice stack St are to be scanned.

A quality criterion can be a desired contrast, for example, also in the context of a diffusion imaging or an imaging with BOLD contrast in which, for example, MR signals of the slices of the slice stack are repeatedly carried out, each according to a different contrast preparation. If a contrast weighted according to the T1, T2 or T2* decay constants of the respectively mapped tissue is to be achieved, the repetition time TR must be sufficient to be able to map the desired decay processes, since otherwise the desired image contrast is not determinable in sufficient quality from the scan data. The minimum repetition time TR can thus simultaneously specify the minimum time that is to elapse between two successive recordings of MR signals of the slices of the slice stack St before, possibly following a changed preparation, MR signals of the slices of the slice stack St are recorded anew, in order to fulfil the quality criterion.

Additionally or alternatively, a quality criterion can be a desired image quality. This can specify, in particular, dependent upon a sensitivity distribution of the receiving coils used for the reception of the MR signals of the slices of the slice stack St, a minimum spacing A' that slices of a slice group from which MR signals are recorded simultaneously are to have from one another. In other words, a minimum spacing A' can be defined by the quality criterion, which determines what spacing the slices of a slice stack must have from one another in order to fulfil the quality criterion. By means of a minimum spacing A' of this type, the coil sensitivity variation in the slice direction is increased and thereby the (diagnostic) image quality for the SMS method used is improved.

On the basis of a slice group scan time $T_{sg}$ specified by the scan protocol for exciting and recording MR signals of a slice group, i.e. the duration that elapses from the excitation of a slice group to the completion of the recording of its MR signals, and the determined minimum repetition time, a number M of possible excitations and recordings of MR signals of a slice group within the determined minimum repetition time TR is determined (block 105), for example, in that the minimum repetition time TR is divided by the slice group scan time $T_{sg}$ and is possibly rounded to a natural number. If a preparation of the spins is to take place in the slice stack before the recording of the MR signals, the preparation duration TP necessary for the preparation must firstly be subtracted from the minimum repetition time TR before the result of this subtraction is divided by the slice group scan time $T_{sg}$ and possibly rounded to a positive integer.

From the number M of possible excitations and recordings of MR signals of a slice group obtained in this way, by multiplication of the number M by the SMS factor F, a number K of slices can be calculated (block 107) from which within the determined minimum repetition time TR, by means of the scan protocol, MR signals can be recorded. The number K is herein larger than the number of slices included by the slice stack to be recorded. Further slices are therefore taken into account.

By subtraction of the number of slices of the slice stack St defined by the slice stack St to be recorded from the number K of slices from which, within the determined minimum repetition time TR, MR signals can be recorded by means of the scan protocol, a number Us of "excess" slices can be determined, from which MR signals can be recorded within the minimum repetition time while observing the at least one quality criterion, said signals not being included, however, by the slice stack St (block 105). The excess slices can be arranged, for example, above and/or below the positions covered by the slice stack St. The exact selection of the arrangement of the excess slices can be made, for example, on the basis of the scan protocol and, for example, the position of the slice stack within the examination object. Thus, on the basis of the determined number K and on the basis of the scan protocol, a number Us of excess slices and their respective slice positions are determined.

Figure 2:
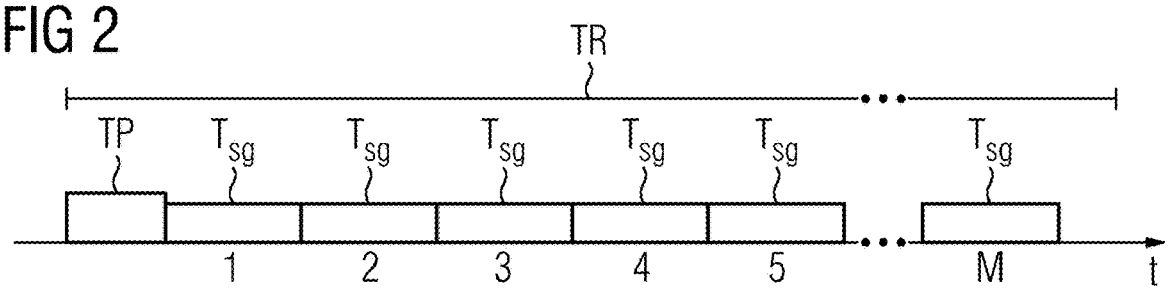
FIG. 2 shows a plot of a timing scheme according to an exemplary embodiment of the disclosure.

FIG. 2 shows, by way of example, a timing scheme which illustrates the temporal relationship of a minimum repetition time TR with the slice group scan time $T_{sg}$. In the example shown, following an (optional) preparation duration TP, e.g. for a diffusion preparation with a desired diffusion value, M slice group scan times $T_{sg}$ fit within the minimum repetition time TR, wherein in each slice group scan time $T_{sg}$ another slice group comprising M or F slices is excited and the generated MR signals are recorded, so that in total M*F=K slices are excited and their MR signals are recorded.

Figure 3:
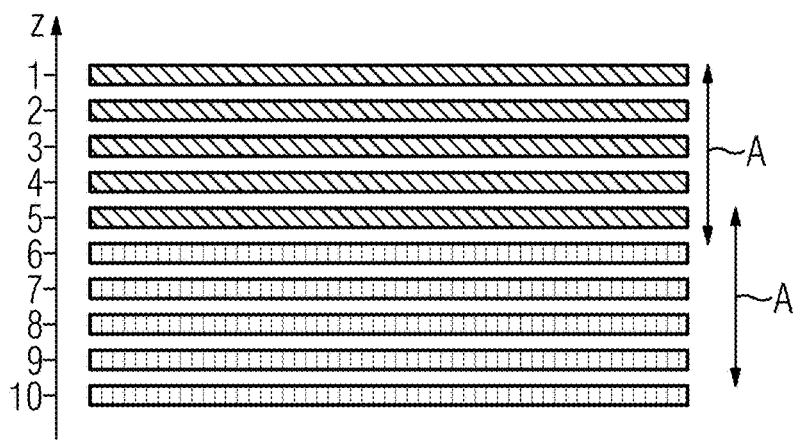
FIG. 3 is an exemplary representation of a slice stack divided into five slice groups.
Figure 4:
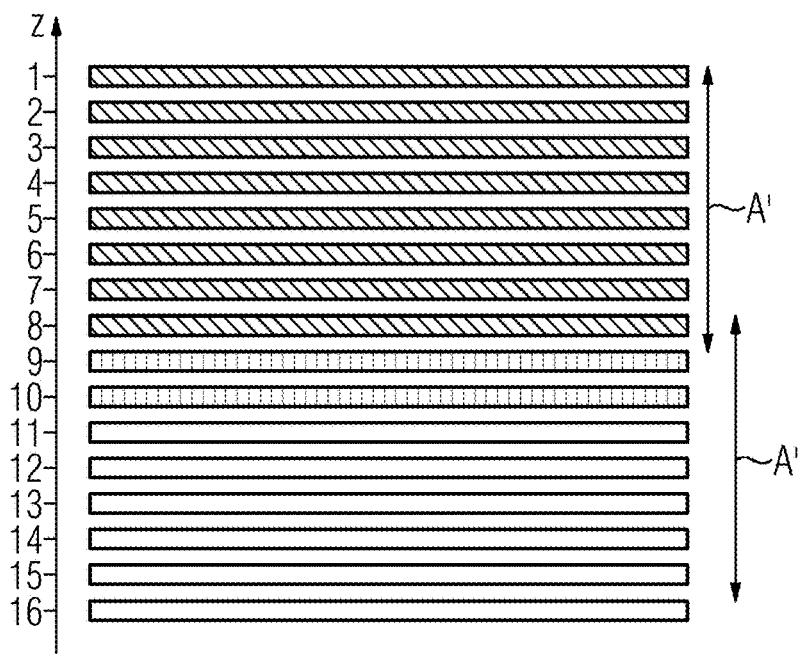
FIG. 4 is an exemplary representation of a slice stack divided into eight slice groups.

In FIGS. 3 and 4, for this purpose, exemplary illustrations of slice stacks which are recorded in different repetition times TR are shown.

The slice stack shown in FIG. 3 consists of ten slices which are to be recorded in five slice groups of two slices each. The slices are arranged, for example, adjacently in the z-direction. The slice groups each comprise a slice from a first position region, shown here shaded diagonally (slice 1 to slice 5), and one from a second position region shown shaded longitudinally (slice 6 to slice 10). The spacing A between the two slices of each slice group is identified by the double arrow for the first and the last slice group.

For the recording of the MR signals of the slice stack shown, a scan time of five times the slice group scan time $T_{sg}$, possibly plus a preparation duration TP, must therefore be used.

If a calculation according to the disclosure of a minimum repetition time TR produces the result that (in order to fulfil a quality criterion) a longer duration for the recording of the MR signals of the 10 slices of the slice stack is available, e.g. three further slice group scan times $T_{sg}$, the slice stack to be recorded shown in FIG. 3 and also in FIG. 4 can be measured.

With the three further slice group scan times $T_{sg}$ available in the example shown, not just five, but (M=) eight slice groups (of two slices each) can be recorded within the minimum repetition time TR. This variant is shown in FIG. 4. The eight slice groups here each comprise a slice from a first position region, shown here shaded diagonally (slice 1 to slice 8), and one from a second position region shown shaded longitudinally or empty (slice 9 to slice 16). Through the recording of eight slice groups instead of just five, the spacing A' (again indicated with a double arrow for the first and last slice group) which lies between each pair of slices of each slice group of FIG. 4 is increased relative to the arrangement in FIG. 3.

However, not only the ten slices included by the slice stack to be recorded, but a total of (K=) 16 slices is recorded by means of the eight slice groups. The (Us=16-10=) six excess slices (slices 11 to 16, shown empty) were arranged in the example of FIG. 4 below the position of the slice stack (slices 1 to 10).

According to the number M of possible excitations and recordings of MR signals of a slice group, M multi-band RF pulses ($MB_1 \ldots MB_M$) are determined which each excite F slices according to the SMS factor F and which thus excite a total of K slices such that the slice stack to be recorded is comprised by the K slices (block 109).

A multi-band RF pulse is herein assembled, for example, in the usual manner from the RF pulses acting for the individual slices of a slice group. Depending on the manner of the pulse sequence type used defined by the scan protocol, for RF pulses which are to bring about an excitation of the spins in a slice, typically flip angles for the RF pulses of approximately 90° are specified, and for RF pulses which are to bring about a refocusing of the spins in a slice, typically flip angles for the RF pulses of approximately 180° are herein specified (e.g. in the context of TSE sequences).

Herein, in the determination of the multi-band RF pulses $MB_1 \ldots MB_M$ for an RF pulse acting on one of the excess slices, a flip angle of zero can be specified. By this means, the increasing of the specific absorption rate (SAR) due to taking account of excess slices is prevented.

It is also possible, in the determination of the multi-band RF pulses $MB_1 \ldots MB_M$ for excess slices, to specify a reduced flip angle, e.g. of approximately 33% of a corresponding non-reduced value of a flip angle to be used specified for non-excess slices, or less, for example, a reduced flip angle of approximately 11% of a corresponding non-reduced value of a flip angle to be used specified for non-excess slices, preferably of approximately 5°. By this means, despite taking account of excess slices, the specific absorption rate (SAR) is increased only slightly. Furthermore, from MR signals recorded from the excess slices with a lower signal strength due to the reduced flip angle, further information can thus be obtained, for example, it can be used as navigator data. How severely a reduced flip angle defined for excess slices is reduced, for example, by what factor a reduced flip angle is reduced relative to a corresponding non-reduced value of a flip angle to be used specified for non-excess slices, can be carried out taking into consideration a desired SAR loading by the RF pulses with a reduced flip angle and a desired signal strength of the scan data generated using the reduced flip angle.

Using the multi-band RF pulses $MB_i$ generated, MR signals $MD_i$ can be recorded (block 111) within the defined minimum repetition time.

Slice separation calibration data SK at least for the slice stack to be recorded and possibly for all K recorded slices is loaded (block 113). The slice separation calibration data SK can be retrieved from a memory store or measured close in time to the recording of the MR signals in block 111 (block 201).

If, in the determination of the multi-band RF pulses $MB_1 \ldots MB_M$ for an RF pulse acting on one of the excess slices, a flip angle of zero has been specified, the slice separation calibration data SK for such excess slices can be occupied with the value zero or with values simulating noise. The slice separation calibration data SK for such excess slices must therefore not be measured or determined in this case, but can be generated without a recording of reference data taking place.

If, in the determination of the multi-band RF pulses $MB_1 \ldots MB_M$ for excess slices, a reduced flip angle has been specified, the slice separation calibration data SK for such excess slices can be determined with the same reduced flip angle, for example, in that reference data from which the slice separation calibration data SK can be determined is also recorded with the reduced flip angle.

It is also conceivable, even for excess slices (although with a non-reduced flip angle) to reduce determined slice separation calibration data SK in its amplitude by multiplication by a factor of between zero and one, in order to adapt it for the excess slices recorded with a reduced flip angle. The factor can depend on the reduced flip angle, in particular on the factor by which the reduced flip angle has been reduced relative to a non-reduced flip angle.

The recorded MR signals $MD_i$ can be separated for each slice group i (i=1 . . . M) respectively into single slice-MR signals $MD_{i1}$ to $MD_{iF}$ of the individual slices included by the slice groups making use of the slice separation calibration data SK (block 113). This can take place in a manner that is typical for SMS techniques.

MR signals recorded from excess slices can be discarded. Computational capacity and storage space can be saved thereby.

It is, however, also conceivable to use the MR signals recorded from excess slices as navigator data, for example, in order to obtain data for a movement correction.

Through the reconstruction of the single slice MR signals $MD_{i1}$ to $MD_{iF}$, image data $BD_j$ (where $1 \leq j \leq K-Us$) of at least one of the K-Us slices included by the slice stack St (block 115) is generated. Herein, this can likewise take place in a manner that is typical for SMS techniques. In particular, for all slices included in the slice stack St to be recorded, image data $BD_j$ can be generated.

Generated image data BDj, recorded MR signals $MD_i$ and/or separated single slice MR signals $MD_{i1}$ to $MD_{iF}$ can be stored, for example, for later use and/or displayed on a display device, for example, for a user (block 117).

FIG. 5 shows a magnetic resonance system 1 according to an exemplary embodiment of the present disclosure. This system comprises a magnet 3 for generating the main magnetic field, a gradient generator 5 for generating the gradient fields, a high frequency (HF) transceiver 7 configured to radiate and receive high frequency signals, and a controller 9 configured for carrying out a method according to the disclosure.

In FIG. 5, these subunits of the magnetic resonance system 1 are shown only roughly schematically. In particular, the high frequency transceiver 7 can consist of a plurality of subunits, for example, a plurality of coils such as the schematically shown coils 7.1 and 7.2 or more coils which can be configured either only to transmit high frequency signals or only to receive the triggered high frequency signals or for both.

In order to examine an examination object U, for example, a patient or a phantom, it can be introduced on a support L into the magnetic resonance system 1, in the scanning volume thereof. The slices Sa and Sb represent, by way of example, two different slices Sa and Sb of the examination object which belong to a slice group and can be recorded simultaneously during a recording of MR signals.

The controller 9 serves to control the magnetic resonance system 1 and can, in particular, control the gradient generator 5 using a gradient controller 5' and the high frequency transceiver 7 using a high frequency transmitting/receiving controller 7'. The high frequency transceiver 7 can comprise a plurality of channels on which signals can be transmitted or received.

The high frequency transceiver 7 is responsible, together with its high frequency transmitting/receiving controller 7' for the generation and irradiation (transmission) of a high frequency alternating field for manipulation of the spins in a region to be manipulated (for example, in layers S to be scanned) of the examination object U. Herein, the center frequency of the high frequency alternating field, also designated the B1 field, is typically adjusted so that, as far as possible, it lies close to the resonance frequency of the spins to be manipulated. Deviations of the center frequency from the resonance frequency are designated off-resonance. In order to generate the B1 field, in the high frequency transceiver 7, currents controlled by means of the high frequency transmitting/receiving controller 7' are applied to the HF coils.

Furthermore, the controller 9 comprises a repetition time determiner 15 with which, according to the disclosure, repetition times TR and thus a number of possible excitations and recordings of scan data per repetition time TR that can be implemented by the high frequency transmitting/receiving controller 7' can be determined. The controller 9 is configured overall to carry out a method according to the disclosure. In an exemplary embodiment, the controller 9 (and/or one or more components therein) includes processor circuitry that is configured to perform one or more operations and/or functions of the controller 9 and/or components therein.

A computer 13 included in the controller 9 is configured to carry out all the computation operations necessary for the required scans and determinations. Preliminary results needed for this or herein determined and results can be stored in a storage unit (memory) S of the controller 9. The units shown are herein not necessarily to be understood as physically separate units, but represent merely a subdivision into units of purpose which, however, can also be realized, for example, in fewer or only in one single physical unit. In an exemplary embodiment, the computer 13 includes processor circuitry that is configured to perform one or more operations and/or functions of the computer 13.

By means of an input/output device 27 of the magnetic resonance system 1, for example, control commands can be fed by a user to the magnetic resonance system and/or results of the controller 9 such as, for example, image data can be displayed.

A method described herein can also exist in the form of a computer program product which comprises a program and implements the described method on a controller 9 when it is executed on the controller 9. An electronically readable data carrier 26 with electronically readable control information stored thereon can also be provided, said control information comprising at least one computer program product as described above and being configured, on use of the data carrier 26 in a controller 9 of a magnetic resonance system 1, to carry out the method described.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for improved recording of scan data of an examination object using a magnetic resonance (MR) system and a simultaneous multi-slice (SMS) method using at least two receiving coils, magnetic resonance (MR) signals being recorded in at least two slice groups of different slices of the examination object, slices included by a slice group being recorded simultaneously during a recording of MR signals, comprising:
   loading a scan protocol with which the MR signals are to be recorded and which includes a slice stack to be recorded, an SMS factor to be used during recording, and at least one quality criterion;
   determining a minimum repetition time based on the at least one quality criterion;
   calculating a first number of slices from which MR signals are recordable with a second number of possible excitations and recordings of MR signals of a slice group within the determined minimum repetition time, the second number being determined based on: a slice group scan time specified by the scan protocol for exciting and recording MR signals of a slice group, and the determined minimum repetition time;
   determining multi-band RF pulses for exciting the second number of slice groups each comprising a third number of slices which altogether include the slice stack to be recorded;
   recording the MR signals using the multi-band RF pulses within the determined minimum repetition time;
   loading slice separation calibration data for the slice stack to be recorded;
   separating the MR signals of the slice groups respectively into single slice MR signals of the individual slices included by the slice groups based on the slice separation calibration data; and
   reconstructing the single slice MR signals of at least one slice included by the slice stack to be recorded to generate image data the slice.

2. The method as claimed in claim 1, wherein a quality criterion is a desired contrast and/or a desired image quality.

3. The method as claimed in claim 1, further comprising: determining a number of excess slices and respective slice positions of the excess slices based on: the determined first number, and the scan protocol.

4. The method as claimed in claim 3, wherein MR signals recorded from excess slices are discarded.

5. The method as claimed in claim 3, wherein, in determination of multi-band RF pulses for the excess slices, a flip angle of zero is specified.

6. The method as claimed in claim 5, wherein slice separation calibration data for the excess slices is occupied with a value zero or with values simulating noise.

7. The method as claimed in claim 3, wherein, in determination of multi-band RF pulses for the excess slices, a reduced flip angle being specified that is less than a flip angle used for non-excess slices.

8. The method as claimed in claim 7, wherein the reduced flip angle is 33% or less of the corresponding value of the flip angle used for the non-excess slices.

9. The method as claimed in claim 7, wherein slice separation calibration data for the excess slices is determined with the same reduced flip angle.

10. The method as claimed in claim 3, wherein already recorded slice separation calibration data for the excess slices is reduced in amplitude based on a factor of between zero and one.

11. The method as claimed in claim 10, wherein the factor depends upon the reduced flip angle.

12. The method as claimed in claim 7, wherein the MR signals recorded from excess slices are used as navigator data.

13. The method as claimed in claim 1, wherein:
   slices to be recorded have a slice thickness of less than 1 millimeters, and/or
   the slice stack to be scanned has a thickness of less than 2 centimeters.

14. A magnetic resonance system, comprising:
   a scanner; and
   a controller that is configured to perform the method of claim 1.

15. A computer program which includes a program and is directly loadable into a memory of a controller a magnetic resonance system, when executed by the controller, causes the controller to perform the method as claimed in claim 1.

16. A non-transitory computer-readable storage medium with an executable program stored thereon, that when executed, instructs a processor to perform the method of claim 1.

* * * * *